(12) United States Patent
Musashi

(10) Patent No.: US 10,305,010 B2
(45) Date of Patent: May 28, 2019

(54) LIGHT EMITTING DEVICE

(71) Applicant: NICHIA CORPORATION, Anan-shi, Tokushima (JP)

(72) Inventor: Naoki Musashi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/949,975

(22) Filed: Apr. 10, 2018

(65) Prior Publication Data

US 2018/0301608 A1 Oct. 18, 2018

Related U.S. Application Data

(63) Continuation of application No. 15/363,773, filed on Nov. 29, 2016, now Pat. No. 9,966,520.

(30) Foreign Application Priority Data

Nov. 30, 2015 (JP) .................................. 2015-234114

(51) Int. Cl.
*H01L 33/48* (2010.01)
*H01L 33/62* (2010.01)

(52) U.S. Cl.
CPC ............ *H01L 33/62* (2013.01); *H01L 33/483* (2013.01); *H01L 33/486* (2013.01)

(58) Field of Classification Search
CPC ...... H01L 33/62; H01L 33/483; H01L 33/486
USPC .................................................. 257/99, 100
See application file for complete search history.

(56) References Cited

U.S. PATENT DOCUMENTS

| 2005/0156187 A1 | 7/2005 | Isokawa et al. |
| 2009/0121253 A1 | 5/2009 | Abe |
| 2011/0062482 A1 | 3/2011 | Solomensky et al. |
| 2012/0112227 A1* | 5/2012 | Toyama .............. H01L 25/0753 257/98 |

(Continued)

FOREIGN PATENT DOCUMENTS

| JP | 07-263754 A | 10/1995 |
| JP | 2003-264267 A | 9/2003 |

(Continued)

OTHER PUBLICATIONS

Non-Final Office Action for U.S. Appl. No. 15/363,773 dated Jul. 3, 2017.

(Continued)

*Primary Examiner* — Matthew E Warren
(74) *Attorney, Agent, or Firm* — Foley & Lardner LLP

(57) ABSTRACT

A light emitting device includes a support substrate; a conductive wiring located on an upper surface of the support substrate; a light emitting element disposed on an upper surface of the conductive wiring via a bonding member interposed therebetween; and a frame body located on an upper surface of the support substrate. The frame body has a plurality of recessed portions on an inner lateral surface surrounding the light emitting element in a top view of the light emitting device. The conductive wiring includes an underlying portion located directly under the light emitting element, and at least two extended portions extending from the underlying portion to a location inside of at least two respective ones of the recessed portions in a top view of the light emitting device.

8 Claims, 5 Drawing Sheets

(56) References Cited

U.S. PATENT DOCUMENTS

| | | | | |
|---|---|---|---|---|
| 2012/0112622 A1* | 5/2012 | Suzuki | ............... | H01L 24/06 |
| | | | | 313/326 |
| 2012/0319158 A1 | 12/2012 | Jin et al. | | |
| 2015/0262987 A1 | 9/2015 | Wada et al. | | |
| 2016/0149104 A1 | 5/2016 | Bergmann et al. | | |

FOREIGN PATENT DOCUMENTS

| | | |
|---|---|---|
| JP | 2006-114635 A | 4/2006 |
| JP | 2008-129043 A | 6/2008 |
| JP | 2009-076524 A | 4/2009 |
| JP | 2011-023484 A | 2/2011 |
| JP | 2015-018842 A | 1/2015 |
| JP | 2015-188053 A | 10/2015 |

OTHER PUBLICATIONS

Notice of Allowance for U.S. Appl. No. 15/363,773 dated Jan. 12, 2018.

* cited by examiner

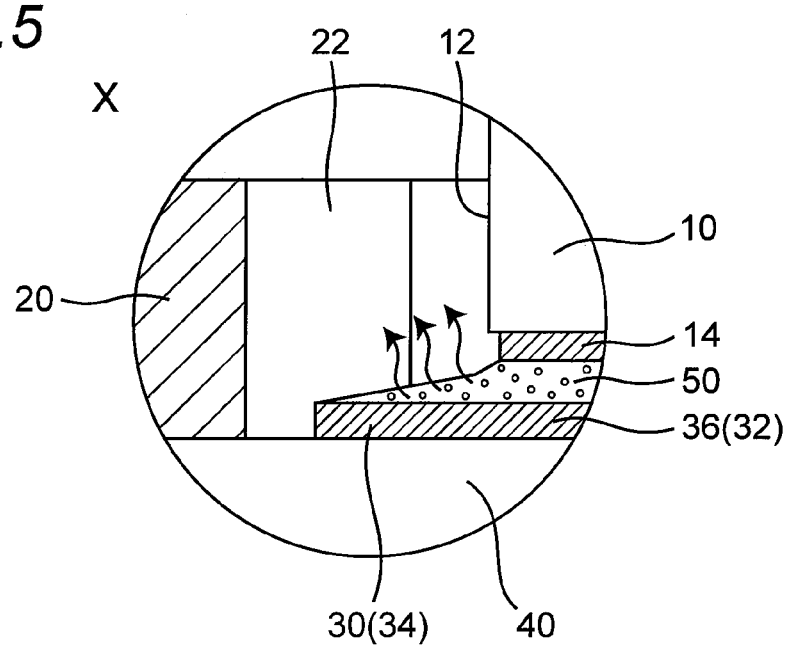
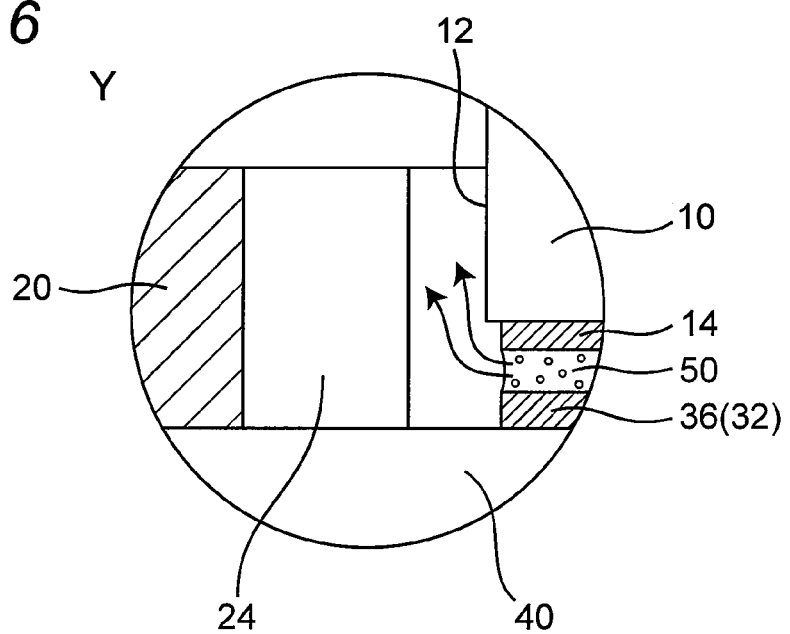

LIGHT EMITTING DEVICE

CROSS-REFERENCE TO RELATED APPLICATIONS

The present application is a continuation of U.S. patent application Ser. No. 15/363,773, filed on Nov. 29, 2016, which claims priority to Japanese Patent Application No. 2015-234114, filed on Nov. 30, 2015, the disclosures of which are hereby incorporated by reference in their entireties.

BACKGROUND

The present disclosure relates to a light emitting device.

In recent years, light emitting devices provided with a light emitting element such as a light emitting diode or a laser diode as a light source have been used in various kinds of lighting and display devices.

For example, light emitting devices are known in which a conductive wiring is disposed on a support substrate, and the conductive wiring and an electrode provided on the lower surface of a light emitting element are electrically connected to each other through a bonding member. In some light emitting devices, a frame body is provided on the periphery of and in proximity to a light emitting element on a support substrate for improving accuracy in mounting of the light emitting element on a conductive wiring (JP 2006-114635 A).

However, for light emitting devices in which a frame body is provided on the periphery of and in proximity to a light emitting element as described above, the bonding strength between the light emitting element and a support substrate is not sufficient, and for example, when the light emitting device is used under a repeatedly vibrating environment, the light emitting element may be detached from the support substrate.

SUMMARY

In order to address the disadvantage described above, a light emitting device according to an embodiment of the present invention includes: a support substrate with a conductive wiring provided on the upper surface thereof; a light emitting element disposed on the upper surface of the conductive wiring with a bonding member interposed therebetween; and a frame body provided on the upper surface of the support substrate, the frame body having a plurality of recessed portions on an inner lateral surface surrounding the light emitting element in proximity to the light emitting element when viewed from the top, the conductive member including: an underlying portion located directly under the light emitting element; and an extended portion extending from the underlying portion to the inside of some recessed portions among the plurality of recessed portions when viewed from the top.

In the light emitting device according to this embodiment of the present invention, detachment of a light emitting element can be reduced even in use under a repeatedly vibrating environment.

BRIEF DESCRIPTION OF THE DRAWINGS

FIG. 5 is a schematic enlarged view of the X part in FIG. 3, which shows an aspect of a bonding member 50 in the vicinity of a first recessed portion 22.

FIG. 6 is a schematic enlarged view of the Y part in FIG. 4, which shows an aspect of the bonding member 50 in the vicinity of a second recessed portion 24.

DETAILED DESCRIPTION OF EMBODIMENTS

Figure 1:
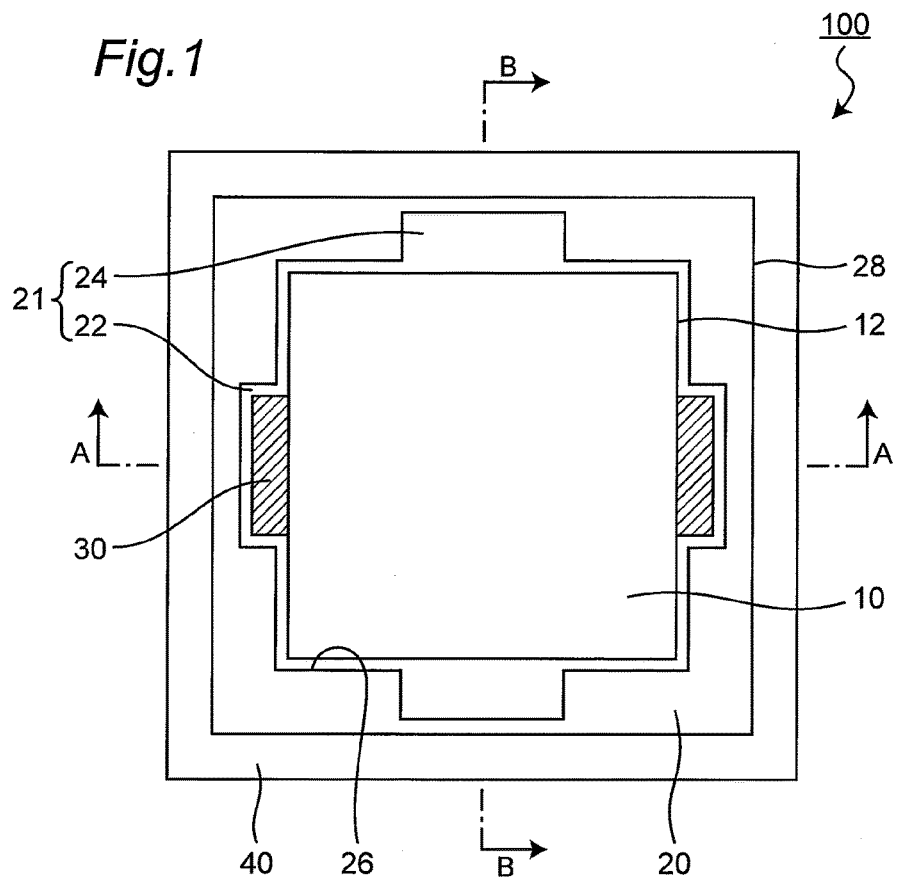
FIG. 1 is a plan view schematically showing a light emitting device according to a first embodiment of the present invention.

The present inventors have given attention to the following. In mounting of a light emitting element on a conductive wiring in a conventional light emitting device, a surplus bonding member on the conductive wiring spreads outward from the whole outer periphery of the light emitting element, so that a flux component in the bonding member existing just below the light emitting element is not sufficiently volatilized, and thus a sufficient bonding strength cannot be obtained between the light emitting element and the conductive wiring.

The present inventors have extensively conducted studies, and resultantly found that by providing in a conductive wiring on a support substrate an underlying portion located directly under a light emitting element and an extended portion extending from the underlying portion to the inside of some recessed portions among a plurality of recessed portions of a frame body, contact failure can be reduced, thereby reducing detachment of the light emitting element in use under a repeatedly vibrating environment.

That is, because a surplus bonding member spreads preferentially to the extended portion having wettability higher than that of the support substrate, sufficient gaps are secured between recessed portions having no extended portion at the inside and a lateral surface of the light emitting element. As a result, a flux component in the bonding member existing just below the light emitting element is easily volatilized to improve the bonding strength between the light emitting element and the conductive wiring, and therefore, detachment of the light emitting element can be reduced. In this way, a light emitting device disclosed herein has been devised.

Hereinafter, embodiments of the present invention will be described in detail with reference to the drawings. The light emitting device described below is intended for implementing the technical concept of the present invention. The present invention is not limited to the described embodiments unless otherwise specified. Details described in one embodiment are applicable to other embodiments. In the following description, terms showing specific directions and positions (e.g. "upper", "lower", "right", "left", "lateral" and other terms including the foregoing terms) are used as necessary, but the use of these terms is intended for making it easy to understand the present invention with reference to the drawings, and the meanings of these terms do not limit the technical scope of the present invention. Parts with like symbols appearing on a plurality of drawings show like parts or members. The sizes, positional relations and so on of members shown in the drawings may be exaggerated for clarity of explanation.

First Embodiment

Figure 2:
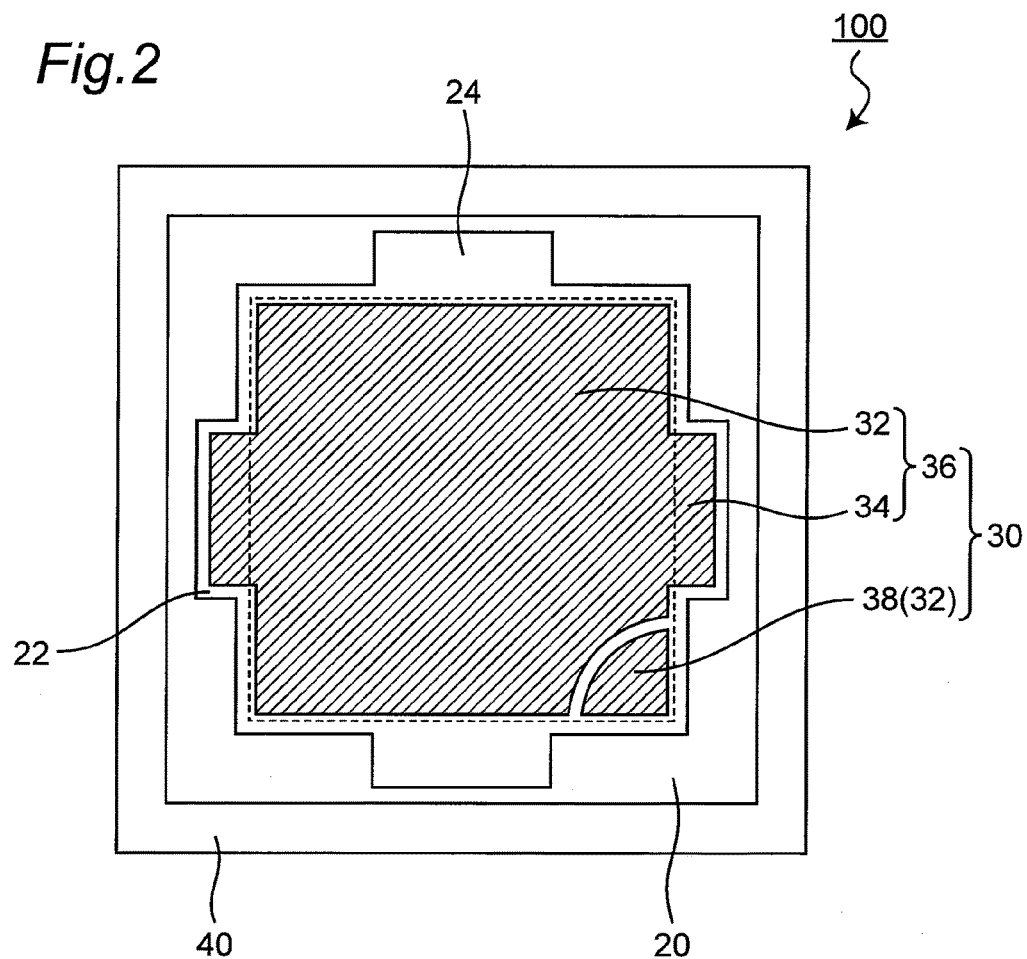
FIG. 2 is a plan view schematically showing an aspect of the light emitting device according to the first embodiment of the present invention from which a light emitting element is removed.
Figure 3:
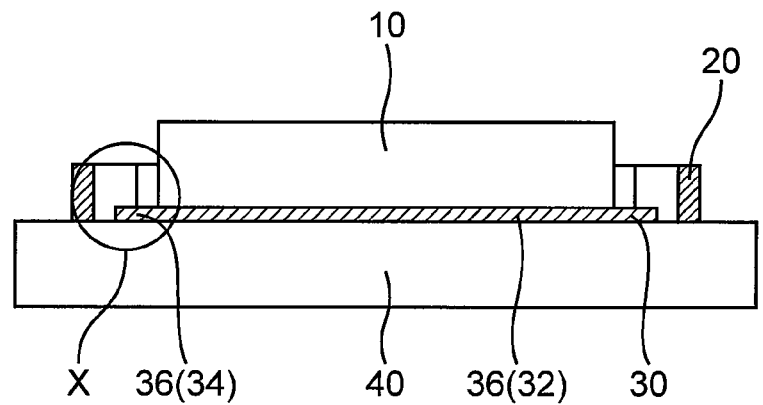
FIG. 3 is a schematic sectional view taken along line A-A in FIG. 1.
Figure 4:
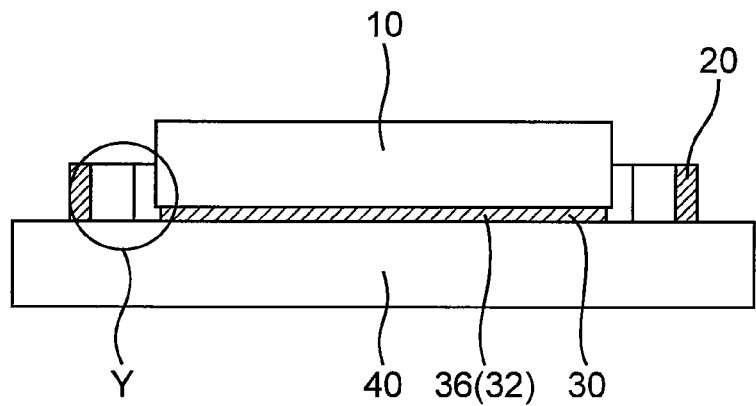
FIG. 4 is a schematic sectional view taken along line B-B in FIG. 1.

FIG. 1 is a plan view schematically showing a light emitting device 100 according to a first embodiment, and FIG. 2 is a plan view schematically showing an aspect of the light emitting device 100 from which a light emitting element 10 is removed, where a part shown by the dotted line shows an area in which the light emitting element 10 is mounted. FIGS. 3 and 4 are sectional views schematically showing the light emitting device 100 taken along line A-A and line B-B, respectively, in FIG. 1. FIG. 5 is a schematic enlarged view of the X part in FIG. 3, which shows an aspect of a bonding member 50 in the vicinity of a first recessed portion 22. FIG. 6 is a schematic enlarged view of the Y part in FIG. 4, which shows an aspect of the bonding member 50 in the vicinity of a second recessed portion 24.

As shown in FIG. 1, the light emitting device 100 includes a support substrate 40; a conductive wiring 30 provided on the upper surface of the support substrate 40; the light emitting element 10 disposed on the upper surface of the conductive wiring 30; and a frame body 20 located on the support substrate 40 and provided to surround the light emitting element 10 when viewed from the top.

The frame body 20 includes the plurality of recessed portions 21 when viewed from the top. A plurality of recessed portions 21 each include a first recessed portion 22 in which a part of the conductive wiring 30 extends, and a second recessed portion 24 in which the conductive wiring 30 is not disposed. Accordingly, as described later, a short-circuit in the light emitting device 100 can be suppressed (hereinafter, sometimes referred to as a short-circuit suppressing effect), and the bonding strength between the light emitting element 10 and the conductive wiring 30 can be improved to reduce detachment of the light emitting element 10 from the conductive wiring 30 (hereinafter, sometimes referred to as a "detachment reduction effect") even in use under a repeatedly vibrating environment.

Hereinafter, constituent members will be described in detail.

(Light Emitting Element)

The light emitting element 10 is substantially rectangular in terms of the outer edge shape when viewed from the top, and has two facing first lateral surfaces and two second lateral surfaces facing each other, and an n-side electrode and a p-side electrode are each formed on the lower surface of the light emitting element 10 which is a mounting surface. The light emitting element 10 is electrically connected to the conductive wiring 30 through the n-side electrode and the p-side electrode. As the light emitting element 10, a light emitting element that is commonly used in the art can be used. Mention is made of, for example, a light emitting element obtained using a nitride semiconductor material of $In_XAl_YGa_{1-X-Y}N$ ($0 \leq X$, $0 \leq Y$, $X+Y \leq 1$).

(Bonding Member 50)

The bonding member 50 is a member for bonding the electrode of the light emitting element 10 to the upper surface of the conductive wiring 30. Examples of the bonding member 50 include Sn—Bi-based, Sn—Cu-based, Sn—Ag-based and Au—Sn-based electrically conductive pastes.

(Conductive Wiring 30)

As shown in FIG. 2, the conductive wiring 30 includes a first conductive member 36, and a second conductive member 38 electrically isolated from the first conductive member 36. The first conductive member 36 is electrically connected to one of the n-side electrode and the p-side electrode of the light emitting element 10, and the second conductive member 38 is electrically connected to the other electrode of the light emitting element 10. The first conductive member 36 includes an underlying portion 32 located directly under the light emitting element 10, and an extended portion 34 extending from the underlying portion 32 to the inside of some recessed portions (i.e. first recessed portion 22) among a plurality of recessed portions 21 of the frame body 20. The second conductive member 38 includes the underlying portion 32.

As shown in FIG. 3, the extended portion 34 of the first conductive member 36 extends outward from a lateral surface 12 of the light emitting element 10 to the inside of the first recessed portion 22. Further, as shown in FIG. 5, the lower surface of the light emitting element 10 is provided with an electrode 14, and the electrode 14 and the first conductive member 36 are electrically connected to each other through the bonding member 50. Since the first conductive member 36 has the extended portion 34, the surplus bonding member 50 spread over the extended portion 34 having wettability higher than that of the support substrate 40 rather than spreading over the support substrate 40 existing on the periphery of the underlying portion 32 (particularly between the underlying portion of the first conductive member 36 and the underlying portion of the second conductive member 38) when viewed from the top, in mounting of the light emitting element 10 on the conductive member 30, even if the bonding member 50 is excessively fed to the first conductive member 36. Accordingly, the surplus bonding member 50 can be prevented from spreading from the first conductive member 36 to the second conductive member 38, and resultantly a short-circuit in the light emitting device 100 can be suppressed.

The extended portion 34 may have any shape such as a shape having a curved line, or a rectangular shape as long as it extends from the underlying portion 32 to the inside of the first recessed portion 22. Preferably, the extended portion 34 has a shape identical to that of the first recessed portion 22 when viewed from the top. When the extended portion 34 has such shape, the area of the extended portion 34 can be increased, so that a larger amount of the surplus bonding member 50 can spread over the extended portion 34, and therefore the short-circuit suppressing effect can be further improved.

The first conductive member 36 may have only one extended portion 34, but preferably has a plurality of extended portions 34. When the first conductive member 36 has a plurality of extended portions 34, a larger amount of the surplus bonding member 50 can spread, and therefore the short-circuit suppressing effect can be further improved. When the first conductive member 36 has a plurality of extended portions 34, one extended portion 34 may extend outward from the position of one lateral surface of the light emitting element 10, or a plurality of extended portions 34 may extend outward from the position of one lateral surface of the light emitting element 10 when viewed from the top.

When the first conductive member 36 has two extended portions 34 as shown in FIG. 2, it is preferable that the extended portions 34 of the first conductive member 36 extend outward from the underlying portion 32 of the first conductive member 36 at the respective positions of two facing lateral surfaces in the lateral surfaces 12 of the light emitting element 10. That is, the light emitting element 10 is substantially rectangular in terms of the outer edge shape when viewed from the top, and has two first lateral surfaces facing each other and two second lateral surfaces facing each other, and a plurality of recessed portions 21 includes first recessed portions 22 in which the extended portion 34 extends and which are provided opposite, respectively, to the two first lateral surfaces when viewed from the top. In this way, the extended portion 34 extends outward from the two facing lateral surfaces (i.e. first lateral surfaces) of the light emitting element 10, and thus the extended portion 34 is not localized at one portion. The surplus bonding member 50 equally spreads in the horizontal direction of the first conductive member 36, and resultantly positional displacement of the light emitting element 10 can be further reduced, so that the light emitting device 100 having reduced contact failure can be obtained.

The ratio of the area of the extended portion 34 to the area of the first conductive member 36 is preferably 5% or more. When the extended portion 34 has such size, a risk of short-circuit can be effectively and sufficiently suppressed. The ratio of the area of the extended portion to the area of the first conductive member 36 is more preferably 10% or more. Here, when a plurality of extended portions 34 exists, the "area of the extended portion 34" is the total area of a plurality of extended portions 34. The "area of the extended portion 34" is the area of the extended portion 34 existing outside the outer lateral surface 12 of the light emitting element 10 (i.e. outside the dotted line showing an area in which the light emitting element 12 is mounted in FIG. 2).

In the light emitting device 100, the extended portion 34 extends from the underlying portion 32 of the first conductive member 36 which has an area larger than that of the second conductive member 38 as shown in FIG. 2. In this way, the first conductive member 36 having an area larger than that of the second conductive member 38 includes the extended portion 34, and thus as compared to a case where the extended portion 34 extends from the underlying portion 32 of the second conductive member 38, a larger amount of the surplus bonding member 50 can spread over the extended portion 34, so that the short-circuit suppressing effect can be further improved. The extended portion 34 may extend from each of the first conductive member 36 and the second conductive member 38 instead of being included in the first conductive member 36.

Examples of the material of the conductive wiring 30 include Cu, Ni, Pd, W, Cr, Ti, Al, Ag, Au, Fe and alloys thereof. Particularly, it is preferable that the conductive wiring 30 has on the outermost surface a material capable of efficiently reflecting light from the light emitting element 10, such as Al, Ag or an alloy thereof.

(Frame Body 20)

As shown in FIG. 1, the frame body 20 has an inner lateral surface 26 and an outer lateral surface 28, and the inner lateral surface 26 is provided with a plurality of recessed portions 21. The inner lateral surface 26 of the frame body 20 is provided in proximity to the lateral surface 12 of the light emitting element 10, and therefore the frame body 20 serves as a guide in mounting of the light emitting element 10 on the upper surface of the conductive wiring 30, so that positional displacement of the light emitting element 10 can be reduced. As a result, the electrically reliable light emitting device 100 having reduced contact failure can be easily and conveniently obtained. The shape of the inner lateral surface 26 of the frame body 20 except for the lateral surface that forms a plurality of recessed portions 21 is preferably substantially identical to the shape of the lateral surface 12 of the light emitting element 10, so that positional displacement of the light emitting element 10 can be further reduced.

As shown in FIG. 2, a plurality of recessed portions 21 includes at least one first recessed portion 22 in which the extended portion 34 of the conductive wiring 30 extends and at least one second recessed portion 24 in which the extended portion 34 does not disposed. Accordingly, the light emitting device 100 has a detachment suppressing effect in addition to the short-circuit suppressing effect.

More specifically, as shown in FIG. 4 and FIG. 6, the first conductive member 36 does not extend outside the lateral surface 12 of the light emitting element 10 below the lateral surface (i.e. second lateral surface) 12 of the light emitting element 10 which is opposite to the second recessed portion 24. As described above, the surplus bonding member 50 spreads preferentially over the extended portion 34 having wettability higher than that of the support substrate 40 rather than spreading over the support substrate 40 existing on the periphery of the underlying portion 32 when viewed from the top. Accordingly, as shown in FIG. 6, the surplus bonding member 50 does not spread outside the outer edge of the underlying portion 32 of the first conductive member 36 below the lateral surface 12 of the light emitting element 10 which is opposite to the second recessed portion 24. That is, the extended portion 34 of the conductive wiring does not extend to an inside of the second recessed portion 24, and therefore between the second recessed portion 24 and the light emitting element 10, there exists a gap for sufficient volatilization of a flux component in the bonding member 50 existing just below the light emitting element 10. As a result, the bonding strength between the electrode 14 of the light emitting element 10 and the first conductive member 36 is improved, so that an effect of reducing detachment of the light emitting element 10 can be obtained.

Preferably, a plurality of recessed portions 21 has no extended portion therein, and has second recessed portions 24 provided opposite, respectively, to two lateral surfaces facing each other (i.e. second lateral surfaces) of the light emitting element 10. In this way, second recessed portions 24 are provided opposite, respectively, to two lateral surfaces facing each other of the light emitting element 10, i.e. second recessed portions 24 are provided on the lateral surface 12 of the light emitting element 10 without being localized at one portion or in one direction, so that a flux component in the bonding member 50 existing just below the light emitting element 10 can be volatilized equally in the vertical direction of the light emitting element 10 when viewed from the top. As a result, an effect as an adhesive from the bonding member 50 can be given to the light emitting element 10 equally from the upper part and the lower part when viewed from the top, without being localized at one portion or in one direction, and therefore the detachment reduction effect can be further improved in the light emitting device as a whole.

Further, it is preferable that the second recessed portions 24 are formed substantially in the relation of point symmetry with respect to the center of the light emitting element 10 (i.e. the intersection of two diagonals when the light emitting element 10 is rectangular when viewed from the top). When a plurality of second recessed portions 24 is formed in this manner, a flux component in the bonding material 50 existing just below the light emitting element 10 can be volatilized equally to the lateral surface 12 of the light emitting device 10 without being localized at one portion or in one direction. As a result, an effect as an adhesive from the bonding member 50 can be given to the light emitting element 10 more equally from the upper part and the lower part when viewed from the top, without being localized at one portion or in one direction, and therefore the detachment reduction effect can be further improved in the light emitting device as a whole.

A plurality of second recessed portions 24 may be provided for one lateral surface of the light emitting element 10 when viewed from the top, or one second recessed portion 24 may be provided for each of a plurality of lateral surfaces of the light emitting element 10. In any form, when the light emitting device 100 has at least one first recessed portion 22 in which the extended portion 34 extends, and also at least one second recessed portion 24 in which extended portion 34 dose not disposed, a detachment reduction effect can be obtained in addition to a short-circuit suppressing effect.

When having no conductive wiring 30 therein, the second recessed portion 24 may have any shape such as a shape having a curved line, or a rectangular shape when viewed from the top. The second recessed portion 24 is preferably rectangular. When the second recessed portion 24 has such shape, space formed by the second recessed portion 24 can be enlarged, so that a flux component in the bonding member 50 existing just below the light emitting element 10 is more easily volatilized, and therefore the detachment reduction effect can be further improved.

The frame body 20 can be formed of a ceramic, a resin or the like. Alumina which has high light reflectivity is preferable, but other materials may be used as long as a reflection film is formed on the surface. When a resin is used, screen printing etc. may be carried out, or a molded product may be bonded to the support body 40. The frame body 20 can be removed after the light emitting element 10 is mounted.

(Support Substrate 40)

As the support substrate 40, any known material may be used. For example, any of thermoplastic resins such as polyphthalamide, liquid crystal polymers and polyimide, and thermosetting resins such as epoxy resin and silicone resin can be used. A ceramic can also be used. Particularly, epoxy resin which is excellent in insulation quality, heat resistance and light resistance, and has proper adhesion with the conductive wiring 30 is suitably used. An inorganic substance such as glass or a ceramic, or the like can be used as a base material. Preferably, the support substrate 40 has light reflectivity, and the base material contains a light reflecting material such as, for example, zinc oxide, titanium oxide, aluminum oxide, zirconium oxide or magnesium oxide. In addition, a coloring agent and so on may be added.

Second Embodiment

Hereinafter, a light emitting device 200 according to a second embodiment will be described mainly for parts that are different from those of the first embodiment. The components of the light emitting device 200 may have the same configurations as those of corresponding components of the first embodiment unless they are specially explained.

The light emitting device 200 is different from the light emitting device 100 according to the first embodiment in that it includes an insulating member 60 filled between a light emitting element 10 and a frame body 20 and covering at least the a lateral surface 12 of the light emitting element 10.

Figure 7:
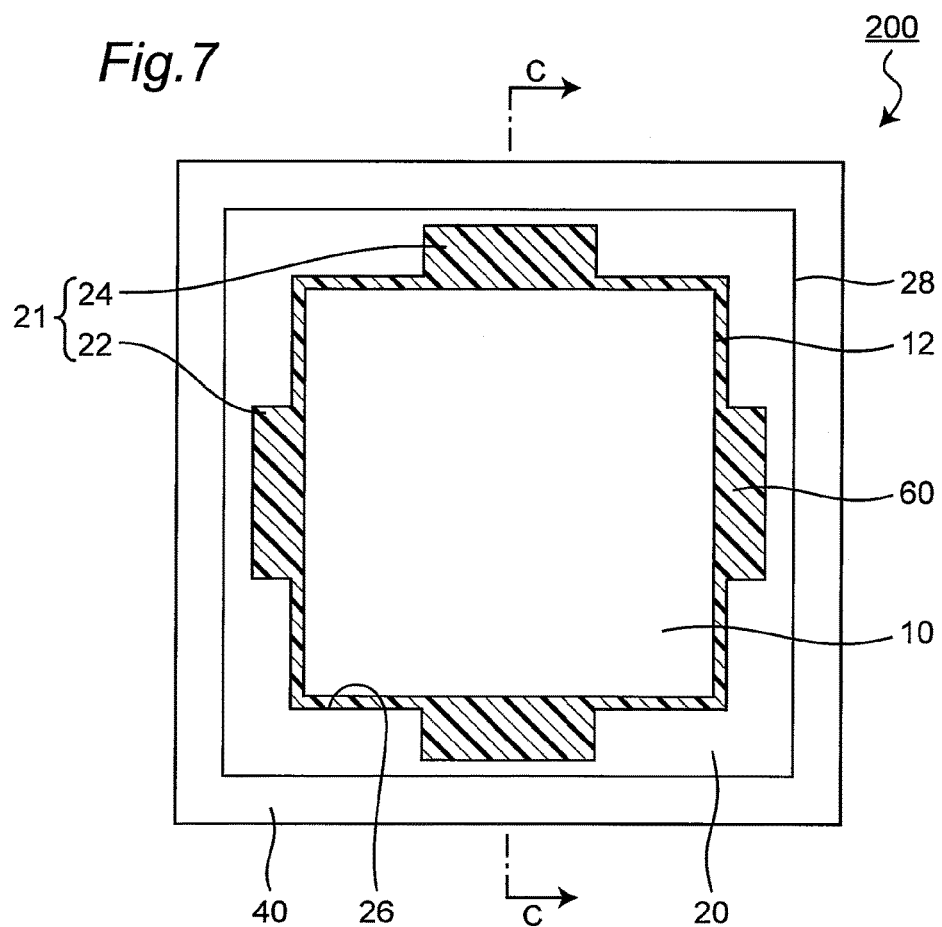
FIG. 7 is a plan view schematically showing a light emitting device according to a second embodiment of the present invention.
Figure 8:
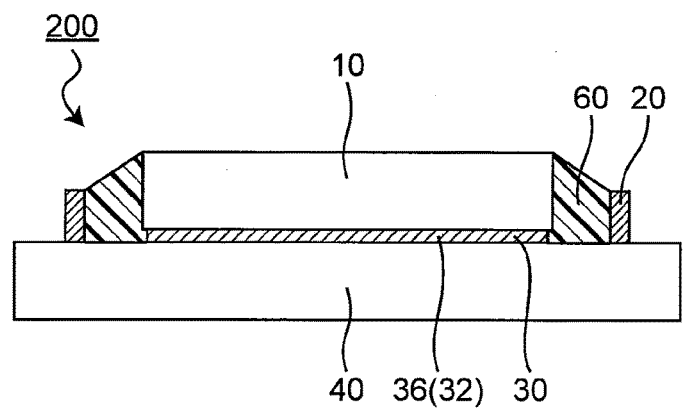
FIG. 8 is a schematic sectional view taken along line C-C in FIG. 7.

FIG. 7 is a plan view schematically showing the light emitting device according to the second embodiment of the present invention, and FIG. 8 is a schematic sectional view taken along line C-C in FIG. 7. As shown in FIG. 7 and FIG. 8, the light emitting device 200 includes the insulating member 60 filled between the light emitting element 10 and the frame body 20 and covering at least the lateral surface 12 of the light emitting element 10. Since the light emitting device 200 includes the insulating member 60, the lateral surface 12 of the light emitting element 10 is supported in the lateral direction (i.e. in the vertical and horizontal direction in FIG. 7) by the insulating member 60, and therefore even if the light emitting device 200 is used in a vibrating environment, positional displacement of the light emitting element 10 in the lateral direction can be reduced, so that the effect of reducing detachment of the light emitting element 10 can be further improved. Since the light emitting device 200 includes the insulating member 60, the light emitting element 10 is in surface contact with or surface-bonded to the insulating member 60 at the lateral surface 12, and therefore even if the light emitting device 200 is used in a vibrating environment, positional displacement of the light emitting element 10 in the longitudinal direction (i.e. in the vertical direction in FIG. 8) can be reduced by a frictional resistance or bonding strength generated due to surface contact with or surface bonding to the insulating member 60, so that the effect of reducing detachment of the light emitting element 10 can be further improved.

When the insulating member 60 is filled so as to cover at least the lateral surface 12 of the light emitting element 10, the effect of reducing detachment of the light emitting element 10 can be improved. The form of the insulating member 60 of the light emitting device 200 is not limited thereto. That is, the insulating member 60 may be filled so as to cover the whole of the upper surface of the light emitting element 10 as long as it is filled so as to cover at least the lateral surface 12 of the light emitting element 10. When the insulating member 60 is filled in this manner, the lateral surface and the upper surface of the light emitting element 10 are supported by the insulating member 60, and therefore even if the light emitting device 200 is used in a vibrating environment, positional displacement of the light emitting element 10 in the lateral direction and the longitudinal direction can be reduced, so that the effect of reducing detachment of the light emitting element 10 can be further improved.

Examples of the material suitable for the insulating member 60 include resins, ceramics, pulp and glass, and particularly, resins are preferable. Examples of the resin suitable for the insulating member 60 include thermosetting resins, thermoplastic resins, modified resins thereof, and hybrid resins including at least one of these resins.

The insulating member 60 may be a light-transmissive material, and it is preferably a reflecting material having a reflectivity of 60% or more to light from the light emitting element 10, more preferably a reflecting material having a reflectivity of 70% or more, 80% or more or 90% or more to light from the light emitting element 10. Accordingly, light passing through the insulating member 60 can be reduced to improve light extraction efficiency from the light emitting surface of the light emitting element 10. Examples of the reflecting material include those containing a light reflecting material such as titanium dioxide or silicon dioxide in the material of the insulating member 60 (e.g. resin).

The insulating member 60 may contain as additives a fibrous filler such as glass fiber or wollastonite, an inorganic filler such as carbon, and a material having a high heat releasing property (e.g. aluminum nitride). Accordingly, the strength, hardness and heat releasing property of the insulating member 60 can be improved. Preferably, these additives are contained in an amount of, for example, about 10 to 95% by weight based on the total weight of the insulating member 60.

What is claimed is:

1. A light emitting device comprising:
   a support substrate;
   a conductive wiring located on an upper surface of the support substrate, the conductive wiring comprising a first conductive member and a second conductive member;
   a light emitting element disposed on an upper surface of the conductive wiring via a bonding member interposed therebetween, the light emitting element including a first lateral surface, a second lateral surface that opposes the first lateral surface, a third lateral surface, and a fourth lateral surface that opposes the third lateral surface; and
   a frame body located on an upper surface of the support substrate, the frame body surrounding the light emitting element in a plan view of the light emitting device;
   wherein the first conductive member comprises a first underlying portion located directly under the light emitting element;
   wherein the second conductive member comprises a second underlying portion located directly under the light emitting element;
   wherein the first and second underlying portions have planar shapes that are different from one another in the plan view;
   wherein the conductive wiring comprises:
      a first extended portion extending from the first or second underlying portion to a location outward of the first lateral surface of the light emitting element in the plan view, and
      a second extended portion extending from the first or second underlying portion to a location outward of the second lateral surface of the light emitting element in the plan view; and
   wherein the first conductive member and the second conductive member are located entirely inward of the third and fourth lateral surfaces of the light emitting element in the plan view.

2. The light emitting device according to claim 1, wherein the first and second extended portions extend from the first underlying portion.

3. The light emitting device according to claim 2, wherein an area of the first underlying portion is larger than an area of the second underlying portion.

4. The light emitting device according to claim 1, further comprising an insulating member located between the light emitting element and the frame body.

5. The light emitting device according to claim 1, wherein:
   the first underlying portion is electrically connected to an n-side electrode of the light emitting element, and the second underlying portion is electrically connected to a p-side electrode of the light emitting element, and
   an area of the first underlying portion is larger than an area of the second underlying portion.

6. The light emitting device according to claim 1, wherein:
   the first underlying portion is electrically connected to a p-side electrode of the light emitting element, and the second underlying portion is electrically connected to an n-side electrode of the light emitting element, and
   an area of the first underlying portion is larger than an area of the second underlying portion.

7. The light emitting device according to claim 1, wherein the bonding member includes an electrically conductive paste that is Sn—Bi based, Sn—Cu based, Sn—Ag based, or Au—Sn based.

8. The light emitting device according to claim 1, wherein the support substrate includes epoxy resin.

* * * * *